United States Patent
Liao et al.

(10) Patent No.: US 12,432,852 B2
(45) Date of Patent: Sep. 30, 2025

(54) CIRCUIT BOARD STRUCTURE WITH EMBEDDED CERAMIC SUBSTRATE AND MANUFACTURING PROCESS THEREOF

(71) Applicant: TONG HSING ELECTRONIC INDUSTRIES, LTD., Taipei (TW)

(72) Inventors: Yu-Hsien Liao, Taipei (TW); Shih-Han Wu, Taipei (TW); Jhih-Wei Lai, Taipei (TW); Jian-Yu Shih, Taipei (TW); Ming-Yen Pan, Taipei (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 259 days.

(21) Appl. No.: 18/142,974

(22) Filed: May 3, 2023

(65) Prior Publication Data

US 2024/0276636 A1 Aug. 15, 2024

(30) Foreign Application Priority Data

Feb. 9, 2023 (TW) ................. 112104576

(51) Int. Cl.
*H05K 1/03* (2006.01)
*H05K 1/11* (2006.01)
(Continued)

(52) U.S. Cl.
CPC .......... *H05K 1/0306* (2013.01); *H05K 1/115* (2013.01); *H05K 3/022* (2013.01); *H05K 3/241* (2013.01); *H05K 3/386* (2013.01)

(58) Field of Classification Search
CPC .......... H05K 1/14; H05K 1/142; H05K 1/185; H05K 1/186; H05K 1/0306;
(Continued)

(56) References Cited

U.S. PATENT DOCUMENTS

2006/0283547 A1* 12/2006 Yuri ............... H05K 1/185
257/E23.079
2012/0199955 A1* 8/2012 Sun ............... H01L 23/3677
257/629
(Continued)

FOREIGN PATENT DOCUMENTS

CN 111901987 A 11/2020
TW 201824969 A 7/2018

OTHER PUBLICATIONS

Office Action dated Sep. 20, 2023 of the corresponding Taiwan patent application No. 112104576.

*Primary Examiner* — Roshn K Varghese
(74) *Attorney, Agent, or Firm* — Li & Cai Intellectual Property Office

(57) ABSTRACT

This disclosure is related to a circuit board structure with an embedded ceramic substrate. A circuit substrate includes an insulating base, a first copper foil and a through-hole portion. A ceramic substrate is disposed in the through-hole portion and includes a ceramic substrate and a second copper foil. A plurality of positioning parts are arranged between the insulating base and the ceramic base. An adhesive layer is disposed between the insulating base and the ceramic base to seal the through-hole portion. A metal layer is disposed on the first copper foil and the second copper foil to cover the adhesive layer exposed from the through-hole portion. The metal layer is patterned to form a circuit layer. This disclosure also provides a manufacturing process of a circuit board structure with an embedded ceramic substrate.

10 Claims, 7 Drawing Sheets

(51) Int. Cl.
*H05K 3/02* (2006.01)
*H05K 3/24* (2006.01)
*H05K 3/38* (2006.01)

(58) Field of Classification Search
CPC .......... H05K 2201/048; H05K 3/4602; H05K 3/4697; H05K 3/4694; H01L 23/5385; H01L 2924/09701
See application file for complete search history.

(56) References Cited

U.S. PATENT DOCUMENTS

| | | | | |
|---|---|---|---|---|
| 2013/0025914 | A1* | 1/2013 | Naganuma | H05K 3/4694 |
| | | | | 29/830 |
| 2014/0022752 | A1* | 1/2014 | Wille | H05K 1/142 |
| | | | | 361/792 |
| 2014/0144686 | A1* | 5/2014 | Shimizu | H05K 3/4602 |
| | | | | 174/258 |
| 2015/0382468 | A1* | 12/2015 | Lin | H05K 1/0204 |
| | | | | 361/767 |

* cited by examiner

CIRCUIT BOARD STRUCTURE WITH EMBEDDED CERAMIC SUBSTRATE AND MANUFACTURING PROCESS THEREOF

BACKGROUND OF THE DISCLOSURE

Technical Field

This disclosure relates to a circuit board, and more particularly relates to a circuit board structure with an embedded ceramic substrate and a manufacturing process thereof.

Description of Related Art

The development of electronic products tends to be thinner, smaller, and multi-functional, and the design of circuit boards applied in electronic products is also gradually evolved into small size, high distribution density of circuit and well transmission performance.

Moreover, the heat generation of electronic components may be increased with the increasing of performance. In order to improve the heat dissipation performance of the circuit board, using a ceramic substrate with good heat dissipation efficiency as a circuit carrier is one of design options for the circuit boards in the related art. Furthermore, since the cost of the ceramic substrate is high, the ceramic substrate is embedded in circuit boards and electronic components are mounted thereon to configure a circuit board with an embedded ceramic substrate to achieve the purpose of reducing cost.

However, the ceramic substrates of the related art may have problems of displacement and rework when being embedded in circuit boards by using a jig, and that results in time-consuming and a lower manufacturing yield.

In view of the above drawbacks, the inventor proposes this disclosure based on his expert knowledge and elaborate researches in order to solve the problems of related art.

SUMMARY OF THE DISCLOSURE

One object of this disclosure is to provide a circuit board structure with an embedded ceramic substrate and a manufacturing process thereof to shorten the manufacturing time and improve the manufacturing yield.

This disclosure is a circuit board structure with an embedded ceramic substrate. The circuit board structure includes a circuit substrate, a ceramic substrate, a plurality of positioning parts, an adhesive layer, and a metal layer. The circuit substrate includes an insulating base, a first copper foil disposed on the insulating base and a through-hole portion disposed in the insulating base. The ceramic substrate is disposed in the through-hole portion. The ceramic substrate includes a ceramic base and a second copper foil disposed on the ceramic base. The positioning parts are arranged between the insulating base and the ceramic base. The adhesive layer is disposed between the insulating base and the ceramic base to seal the through-hole portion. The metal layer is arranged on the first copper foil and the second copper foil to cover the adhesive layer exposed from the through-hole portion. The metal layer is patterned to form a circuit layer.

In one embodiment of this disclosure, the insulating base is made of glass fiber, and the ceramic base is made of a synthetic ceramic material of at least one of zirconia toughened alumina (ZTA), aluminum nitride, aluminum oxide and silicon nitride.

In one embodiment of this disclosure, the positioning parts and the ceramic base are integrally formed, and the positioning parts are arranged on a peripheral surface of the ceramic base facing the insulating base. A gap is defined between each of the plurality of positioning parts and the insulating base. The adhesive layer is disposed in the gap.

In one embodiment of this disclosure, the positioning parts and the circuit substrate are integrally formed, and the positioning parts are located on a peripheral surface of the circuit substrate facing the ceramic substrate.

In one embodiment of this disclosure, each positioning part includes a projection with a protrusion width, and a size of the protrusion width is equal to or less than 50 µm.

In one embodiment of this disclosure, the insulating base is provided with at least one insulating via hole, and the first copper foil is disposed on a wall surface of the insulating via hole.

In one embodiment of this disclosure, the ceramic substrate is provided with at least one ceramic via hole, and the second copper foil is disposed on a wall surface of the ceramic via hole.

In one embodiment of this disclosure, the circuit board structure further includes a chip disposed on the circuit layer and located above the ceramic substrate.

This disclosure is a manufacturing process of the circuit board structure with an embedded ceramic substrate. The manufacturing process includes: a) providing a circuit substrate, the circuit substrate including an insulating base, a first copper foil disposed on the insulating base and a through-hole portion disposed in the insulating base; b) providing a ceramic substrate, the ceramic substrate including a ceramic base and a second copper foil disposed on the ceramic base, and a plurality of positioning parts arranged between the insulating base and the ceramic base; c) placing the ceramic substrate in the through-hole portion; d) disposing an adhesive layer between the insulating base and the ceramic base to seal the through-hole portion; e) forming a metal layer on the first copper foil and the second copper foil; and f) patterning the metal layer to form a circuit layer.

In one embodiment of this disclosure, the step a) includes defining an insulating via hole in the insulating base, and the first copper foil is disposed in the insulating via hole; and the step b) includes defining a ceramic via hole in the ceramic substrate, and the second copper foil is disposed in the ceramic via hole.

In one embodiment of this disclosure, in the step e), the metal layer is formed through an electroplating process.

In comparison with the related art, the circuit board structure with an embedded ceramic substrate of the disclosure includes a circuit substrate, a ceramic substrate, a plurality of positioning parts, an adhesive layer, and a metal layer. In the manufacturing process of the circuit board structure, the ceramic substrate is placed into the through-hole portion of the circuit substrate without using a jig. Furthermore, through the arrangement of the positioning parts, the ceramic substrate and the circuit substrate are positioned without using a jig when placing the ceramic substrate into the through-hole portion in the subsequent process. The use of jigs in the manufacturing process of the related art is omitted, so that the manufacturing process of the disclosure may be simplified to shorten the manufacturing time. Additionally, the manufacturing yield may be improved to increase the practicability.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
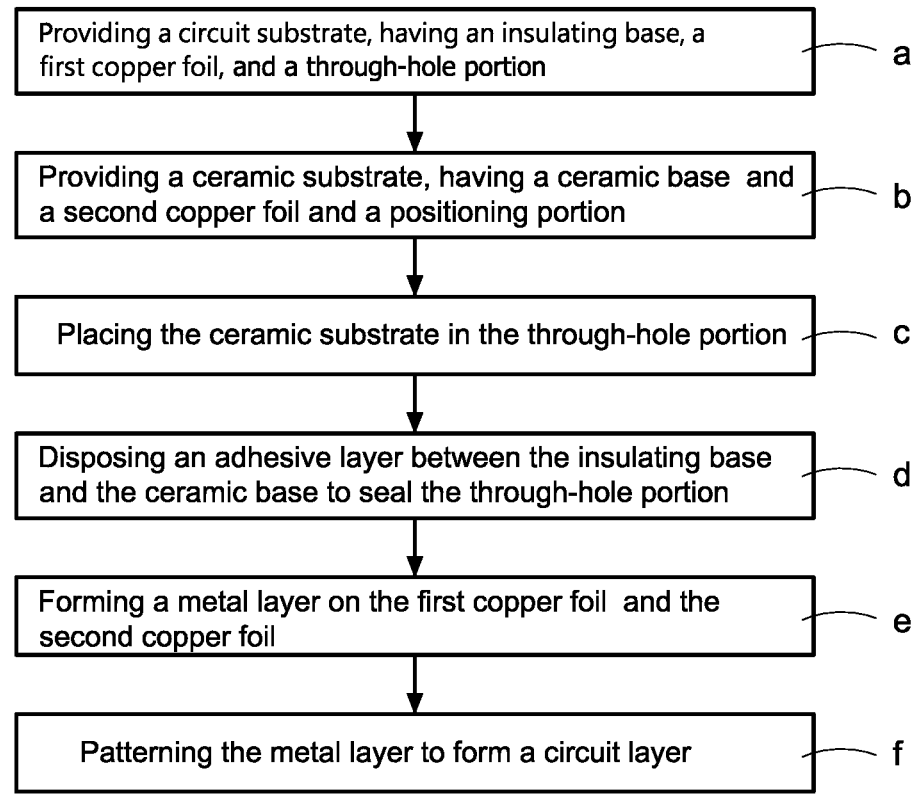
FIG. 1 is a manufacturing flowchart of the circuit board structure with an embedded ceramic substrate in this disclosure.

Please refer to FIG. 1, which is a manufacturing flowchart of the circuit board structure with an embedded ceramic substrate in this disclosure. Please also refer to FIG. 2 to FIG. 7, which illustrate the manufacturing process of the circuit board structure 1 with an embedded ceramic substrate in this disclosure. FIG. 2 to FIG. 7 are schematic views of the embodiments of this disclosure, which are not intended to restrict the dimensions of the components in this disclosure.

Figure 2:
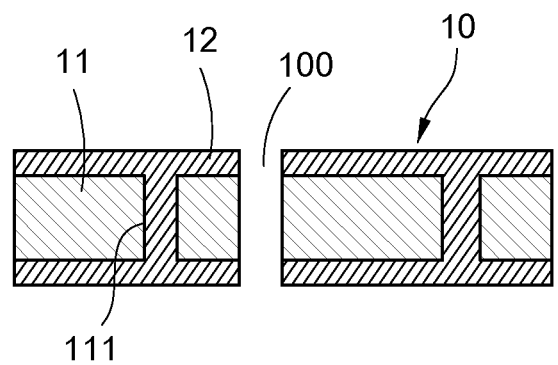
FIG. 2 is a cross-sectional view of the circuit substrate in this disclosure.

Please refer to FIG. 2, which is a cross-sectional view of the circuit substrate in this disclosure. With reference to FIG. 1, the manufacturing process of the circuit board structure with the embedded ceramic substrate in this disclosure includes the step a) of providing a circuit substrate 10. The circuit substrate 10 includes an insulating base 11 and a first copper foil 12 disposed on the insulating base 11. The circuit substrate 10 includes a through-hole portion 100. The through-hole portion 100 penetrates the insulating base 11 and the first copper foil 12 to form a through hole.

In this embodiment, the insulating base 11 is made of glass fiber, but not limited thereto. Additionally, the insulating base 11 is provided with insulating via holes 111. The first copper foil 12 is not only disposed on the upper surface and the lower surface of the circuit substrate 10, but also disposed in the insulating via holes 111.

Figure 3:
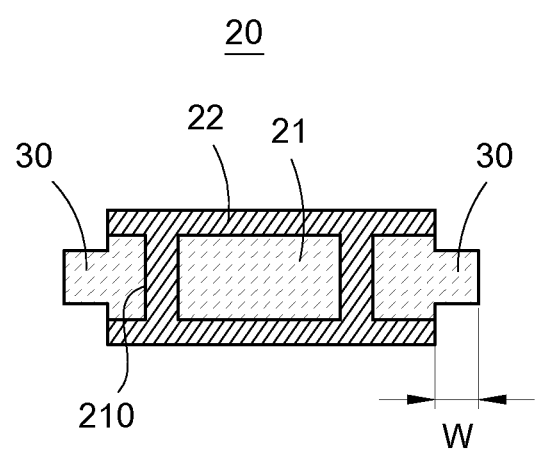
FIG. 3 is a cross-sectional view of the ceramic substrate in this disclosure.

As shown in FIG. 3, which depicts a cross-sectional view of the ceramic substrate in this disclosure. With reference to FIG. 1, the manufacturing process of the circuit board structure with the embedded ceramic substrate further includes the step b) of providing a ceramic substrate 20. The ceramic substrate 20 includes a ceramic base 21 and a second copper foil 22 disposed on the ceramic base 21. The ceramic base 21 is made of a synthetic ceramic material of at least one of zirconia toughened alumina (ZTA), aluminum nitride, aluminum oxide and silicon nitride.

Furthermore, a plurality of positioning parts 30 are arranged between the insulating base 11 and the ceramic base 21. In the embodiment shown in FIG. 3, the positioning parts 30 and the ceramic base 21 are in a one-piece form (or integrally formed), and the positioning parts 30 are arranged on the peripheral surface of the ceramic base 21 facing the insulating base 11 (see FIG. 4). Moreover, in one embodiment of this disclosure, each positioning part 30 includes a projection. Additionally, each positioning part 30 has a protrusion width W, and the protrusion width W is equal to or less than 50 μm. In this embodiment, the ceramic substrate 21 is provided with ceramic via holes 210. The second copper foil 22 is not only disposed on the upper surface and the lower surface of the ceramic substrate 21, but also disposed in the ceramic via holes 210.

Figure 4:
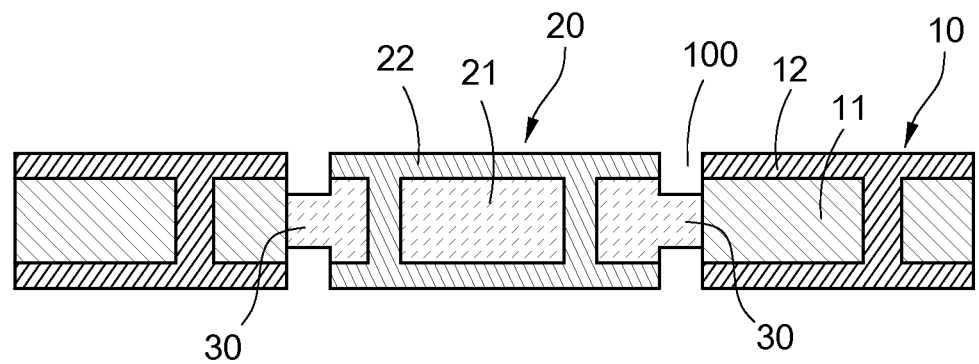
FIG. 4 is a cross-sectional view of disposing the ceramic substrate in the circuit substrate in this disclosure.

Please refer to FIG. 4, which depicts a cross-sectional view of disposing the ceramic substrate in the circuit substrate in this disclosure. With reference to FIG. 1, the manufacturing process of the circuit board structure with the embedded ceramic substrate in this disclosure further includes the step c) of placing the ceramic substrate 20 in the through-hole portion 100.

Moreover, the circuit board structure 1 with the embedded ceramic substrate in this disclosure includes a plurality of positioning parts 30 arranged between the insulating base 11 and the ceramic substrate 21. Therefore, the ceramic substrate 20 is positioned without using a jig when placing the ceramic substrate 20 into the through-hole portion 100. The ceramic substrate 20 may not have displacement in the subsequent process to shorten the manufacturing time.

Figure 5:
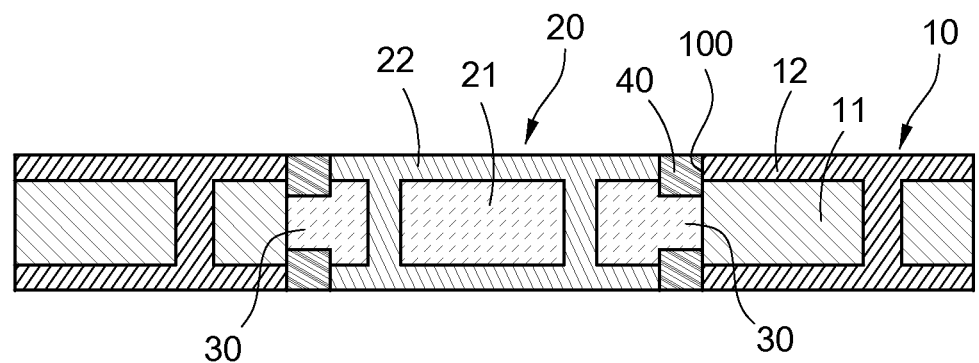
FIG. 5 is a cross-sectional view of the circuit board structure with an embedded ceramic substrate of disposing an adhesive layer in this disclosure.

Please further refer to FIG. 5, which is a cross-sectional view of the circuit board structure with an embedded ceramic substrate of disposing an adhesive layer in this disclosure. With reference to FIG. 1, the manufacturing process of the circuit board structure with the embedded ceramic substrate in this disclosure further includes the step d) of disposing an adhesive layer 40 between the insulating base 21 and the ceramic base 21 to seal the through-hole portion 100. The adhesive layer 40 is fully filled between the insulating base 11 and the ceramic substrate 21. In this embodiment, the adhesive layer 40 is an adhesive.

It should be noted that a gap is defined between the positioning parts 30 and the insulating base 11 (please see the description hereinafter). The adhesive layer 40 is disposed in the gap to make a sealing connection between the insulating base 11 and the ceramic substrate 21. Furthermore, by the arrangement of the positioning parts 30, a fully contact between the ceramic substrate 21 and the insulating base 11 which would in turn result in poor bonding of the adhesive may be avoided. Additionally, the thermal expansion coefficients of the ceramic substrate 21 and the insulating base 11 are different. The insulating base 11 may be prevented from directly contacting the ceramic substrate 21 by arranging the positioning parts 30 between the insulating base 11 and the ceramic substrate 21, and the extrusion problems due to different coefficients of thermal expansion may be avoided in the subsequent high-temperature processes.

Figure 6:
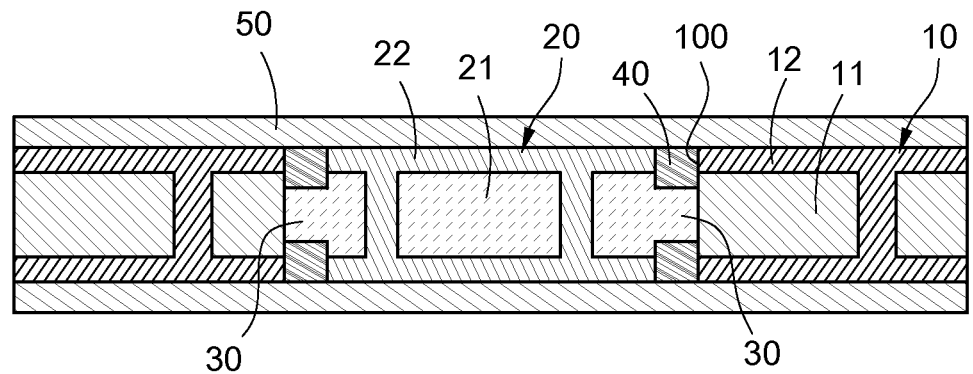
FIG. 6 is a cross-sectional view of the circuit board structure with an embedded ceramic substrate of disposing a metal layer in this disclosure.

Please refer to FIG. 6, which is a cross-sectional view of the circuit board structure with an embedded ceramic substrate of disposing a metal layer in this disclosure. With reference to FIG. 1, the manufacturing process of the circuit board structure with the embedded ceramic substrate in this disclosure further includes the step e) of forming a metal layer 50 on the first copper foil 12 and the second copper foil 22. The metal layer 50 is a metal film, such as a copper foil. Specifically, the metal layer 50 is disposed on the first copper foil 12 and the second copper foil 22 to cover the adhesive layer 40 exposed from the through-hole portion 100. Moreover, in one embodiment of this disclosure, the metal layer 50 is formed through an electroplating process.

Figure 7:
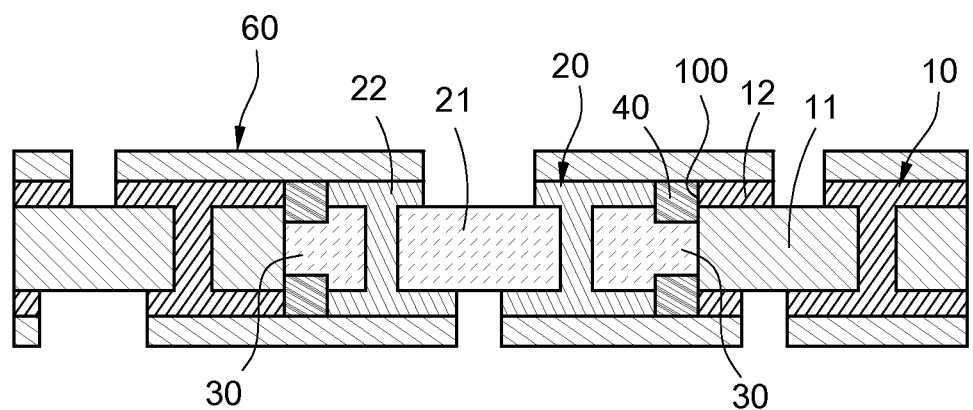
FIG. 7 is a cross-sectional view of the patterned metal layer in this disclosure.

Please further refer to FIG. 7, which is a cross-sectional view of the patterned metal layer in this disclosure. With reference to FIG. 1, the manufacturing process of the circuit board structure with the embedded ceramic substrate further includes the step f) of patterning the metal layer 50, the first copper foil 12 and the second copper foil 22 to form a circuit layer 60. Specifically, the metal layer 50, the first copper foil 12, and the second copper foil 22 form the desired circuit pattern through a patterning process, such as photomask and etching, to complete the manufacturing process of the circuit board structure with an embedded ceramic substrate of this disclosure.

Figure 8:
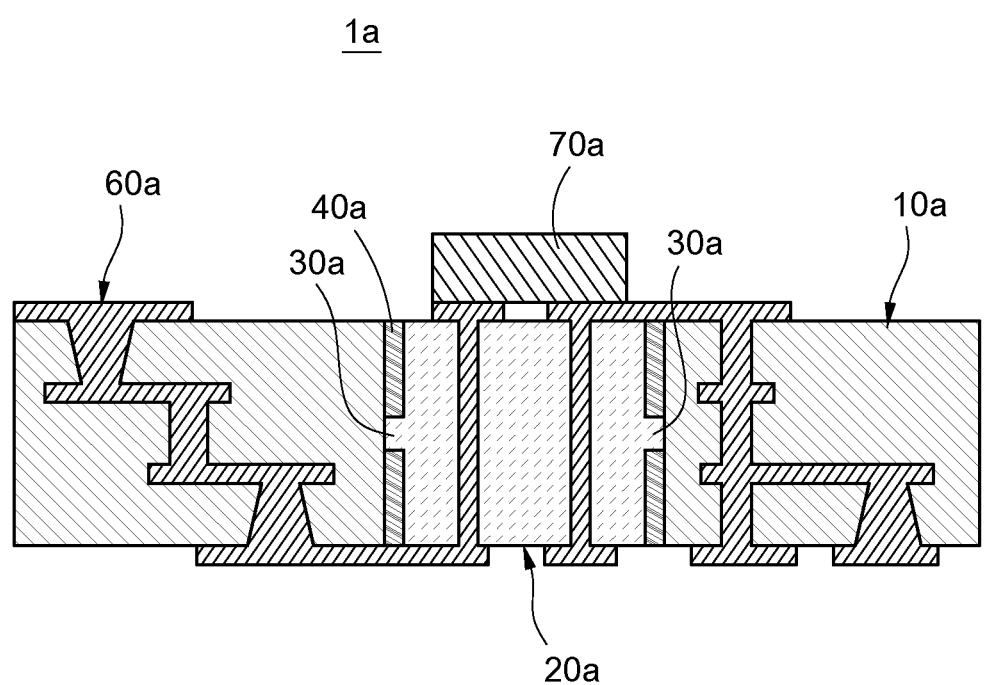
FIG. 8 is a cross-sectional view of an application of the circuit board structure with an embedded ceramic substrate in this disclosure.
Figure 9:
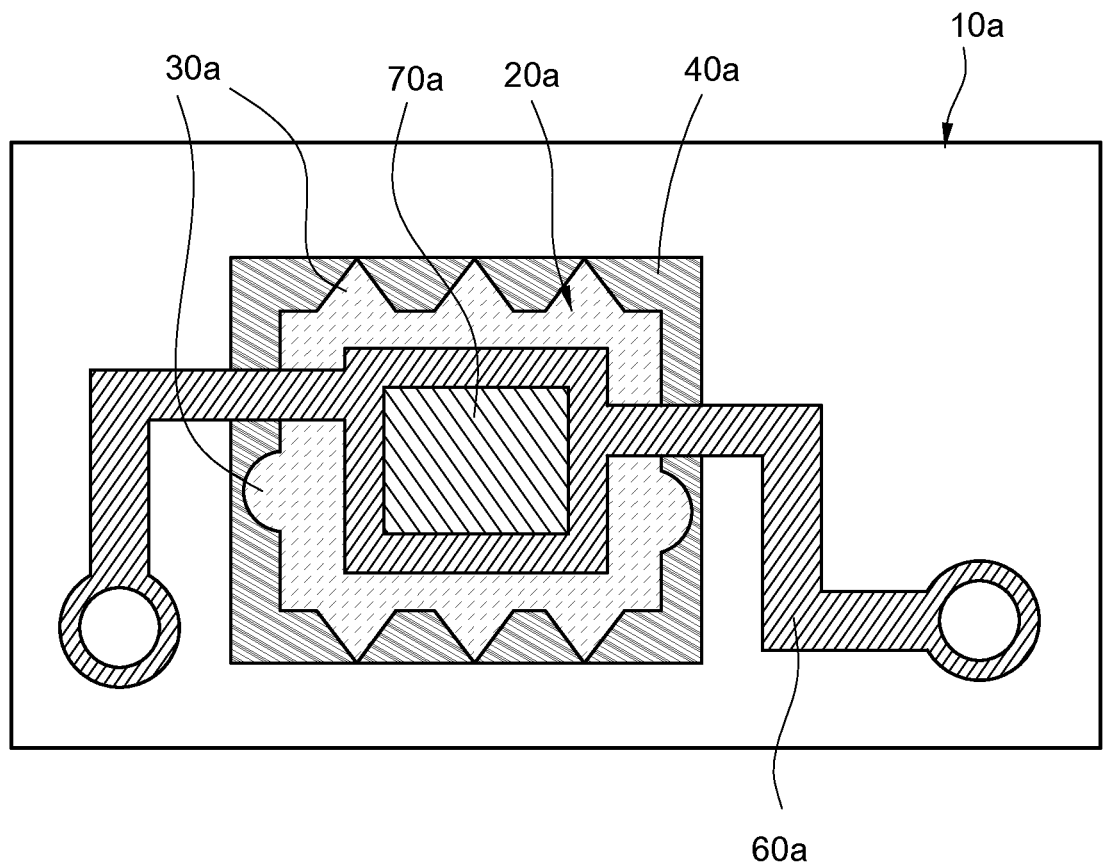
FIG. 9 is a top view of the circuit board structure with an embedded ceramic substrate in this disclosure.

Please further refer to FIG. 8 and FIG. 9, which are respectively a cross-sectional view of an application of the circuit board with an embedded ceramic substrate in this disclosure and a top view of the circuit board structure with an embedded ceramic substrate in this disclosure. As shown in FIG. 8, a circuit board structure 1a with an embedded ceramic substrate includes a circuit substrate 10a, a ceramic substrate 20a, a plurality of positioning parts 30a, an adhesive layer 40a, a circuit layer 60a and a chip 70a. The ceramic substrate 20a is disposed in the circuit substrate 10a. The plurality of positioning parts 30 are arranged between the circuit substrate 10a and the ceramic substrate 20a. The circuit layer 60a is disposed on the circuit substrate 10a and the ceramic substrate 20a. The chip 70a is disposed on the circuit layer 60a and located above the ceramic substrate 20a.

The structure shown in FIG. 8 is an application schematic view of the circuit board structure 1 with an embedded ceramic substrate of FIG. 7. The purpose of FIG. 8 is to illustrate the configuration of disposing a chip on the circuit board structure 1 manufactured according to FIGS. 2-7 to achieve the desired final product. As FIGS. 2-7 are schematic views illustrating the circuit board structure with an embedded ceramic substrate in this disclosure, the skilled person in the related art may adjust the routing and structures of the components according to different requirements of the products. Therefore, in FIG. 8, similar numbers are used for relevant elements shown in FIGS. 2-7. As shown in FIG. 8, a plurality of positioning parts 30a are arranged between the circuit substrate 10a and the ceramic substrate 20a. FIG. 9 is a top view corresponding to FIG. 8. In one embodiment of this disclosure, the ceramic substrate 20a is a rectangular body. The positioning parts 30a are integrally formed (or in a one-piece form) on the peripheral surface of the ceramic substrate 20a facing the circuit substrate 10a. Moreover, each positioning part 30a includes a projection. Additionally, the shape of each positioning part 30a is, but not limited, a triangle or a semicircle etc. With reference to FIG. 3, the protrusion width W of each positioning part 30a is equal to or less than 50 μm. Thus, in the structure shown in FIG. 9, the protrusion width W of the positioning part 30a is defined as the maximum extension width on the lateral side of the positioning part 30a corresponding to FIG. 8. The ceramic substrate 20a may not have displacement or rotation during the manufacturing process through the arrangement of the positioning parts 30a, so that the manufacturing accuracy of the circuit board structure 1a with an embedded ceramic substrate can be controlled, and the manufacturing yield is improved. More specifically, a gap may be formed between the positioning part 30a and the insulating base of the circuit substrate 10a through disposing the positioning part 30a and restricting the protrusion width W of the positioning part 30a equal to or less than 50 μm. By the arrangement of the gap, a fully contact between the ceramic substrate 21 and the insulating base 11 which would in turn result in poor bonding of the adhesive may be avoided.

Figure 10:
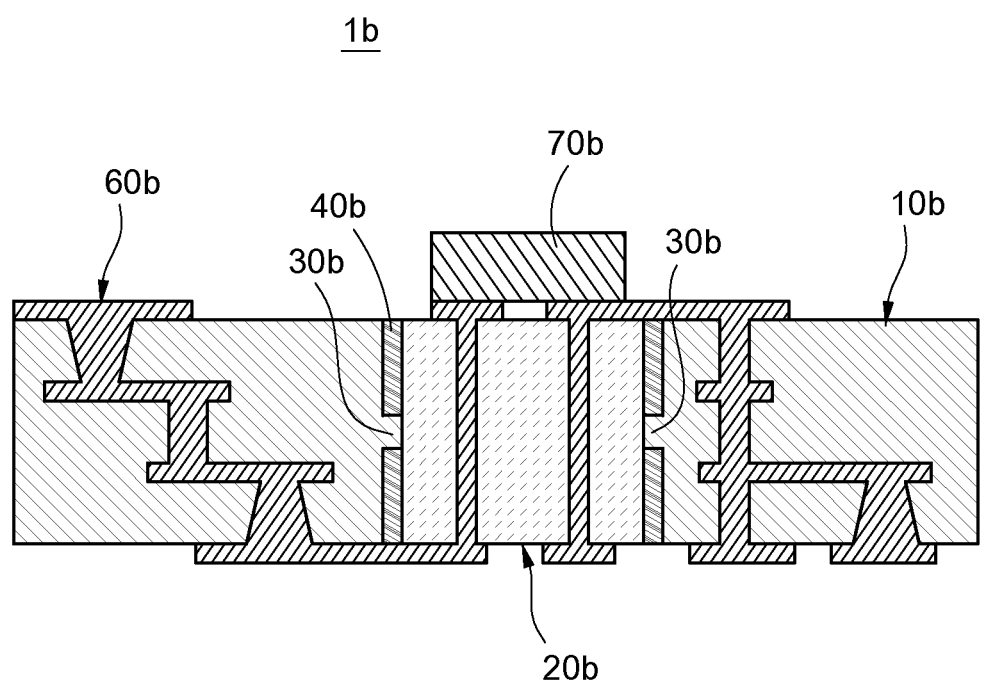
FIG. 10 is a cross-sectional view of another application of the circuit board structure with an embedded ceramic substrate in this disclosure.

Please refer to FIG. 10, which is a cross-sectional view of another application of the circuit board structure with an embedded ceramic substrate in this disclosure. The circuit board structure 1b of this embodiment may be manufactured as per the manufacturing process diagram in FIG. 1 and have a similar structure shown in FIGS. 2-7, but in this embodiment the positioning parts 30 shown in FIGS. 3-7 are integrally formed (or in a one-piece form) on the peripheral surface of the circuit substrate 10b facing the ceramic substrate 20b. In other words, in the structure shown in FIG. 2, the positioning parts are arranged on the peripheral surface of the circuit substrate 10 facing the through-hole portion 100 (for placing the ceramic substrate 20). As shown in FIG. 10, a circuit board structure 1b with an embedded ceramic substrate includes a circuit substrate 10b, a ceramic substrate 20b, a plurality of positioning parts 30b, an adhesive layer 40b, a circuit layer 60b and a chip 70b. Like the previous embodiments, the protrusion width of the positioning part 30b is equal to or less than 50 μm. The ceramic substrate 20b may not have displacement or rotation during the manufacturing process through the arrangement of the positioning parts 30b, so that the manufacturing accuracy of the circuit board structure 1b with an embedded ceramic substrate can be controlled, and the manufacturing yield is improved. More specifically, a gap may be formed between the positioning part 30b and the insulating base of the circuit substrate 10b through disposing the positioning part 30b and restricting the protrusion width of the positioning part 30b equal to or less than 50 μm. By the gap, a fully contact between the ceramic substrate 21 and the insulating base 11 which would in turn result in poor bonding of the adhesive may be avoided.

While this disclosure has been described by means of specific embodiments, numerous modifications and variations could be made thereto by those skilled in the art without departing from the scope and spirit of this disclosure set forth in the claims.

What is claimed is:

1. A manufacturing process of a circuit board structure with an embedded ceramic substrate, the manufacturing process comprising:
  a) providing a circuit substrate, the circuit substrate comprising an insulating base having two first surfaces opposite to each other, a first copper foil disposed on the two first surfaces of the insulating base and a through-hole portion disposed in the insulating base;
  b) providing a ceramic substrate, the ceramic substrate comprising a ceramic base having two second surfaces opposite to each other and a second copper foil disposed on the two second surfaces of the ceramic base, and a plurality of positioning parts arranged between the insulating base and the ceramic base, wherein the ceramic substrate comprises at least one ceramic via hole, and the second copper foil is disposed on a wall surface of the ceramic via hole;

c) placing the ceramic substrate in the through-hole portion, wherein the positioning parts, the circuit substrate, and the ceramic substrate jointly defines:
   a first gap arranged at a first side of the positioning parts; and
   a second gap arranged at a second side of the positioning parts that is opposite to the first side;
d) disposing an adhesive layer between the insulating base and the ceramic base to seal the through-hole portion, wherein a first part of the adhesive layer is filled in the first gap, a second part of the adhesive layer is filled in the second gap and is separated from the first part through the positioning parts, and the positioning parts are embedded in the adhesive layer;
e) forming a metal layer on the first copper foil and the second copper foil; and
f) patterning the metal layer to form a circuit layer.

2. The manufacturing process according to claim 1, wherein the step a) further comprises: defining an insulating via hole in the insulating base, and disposing the first copper foil in the insulating via hole.

3. The manufacturing process according to claim 1, wherein the step e) further comprises: forming the metal layer by an electroplating process.

4. A circuit board structure with an embedded ceramic substrate, the circuit board structure comprising:
   a circuit substrate, comprising an insulating base having two first surfaces opposite to each other, a first copper foil disposed on the two first surfaces of the insulating base and a through-hole portion disposed in the insulating base;
   a ceramic substrate, disposed in the through-hole portion, and comprising a ceramic base having two second surfaces opposite to each other and a second copper foil disposed on the two second surfaces of the ceramic base;
   a plurality of positioning parts, arranged between the insulating base and the ceramic base and spaced apart from the two first surfaces of the circuit board and the two second surfaces of the ceramic substrate, wherein the positioning parts, the circuit substrate, and the ceramic substrate jointly defines:
      a first gap arranged at a first side of the positioning parts; and
      a second gap arranged at a second side of the positioning parts that is opposite to the first side;
   an adhesive layer, disposed between the insulating base and the ceramic base and sealing the through-hole portion, wherein a first part of the adhesive layer is filled in the first gap, a second part of the adhesive layer is filled in the second gap and is separated from the first part through the positioning parts, and the positioning parts are embedded in the adhesive layer; and
   a metal layer, arranged on the first copper foil and the second copper foil and covering the adhesive layer exposed from the through-hole portion, wherein a circuit layer is formed by patterning the metal layer;
   wherein the ceramic substrate comprises at least one ceramic via hole, and the second copper foil is disposed on a wall surface of the ceramic via hole.

5. The circuit board structure according to claim 4, wherein the insulating base is made of glass fiber, and the ceramic base is made of a synthetic ceramic material of at least one of zirconia toughened alumina (ZTA), aluminum nitride, aluminum oxide and silicon nitride.

6. The circuit board structure according to claim 4, wherein the positioning parts and the ceramic base are in a one-piece form, and the positioning parts are arranged on a peripheral surface of the ceramic base facing the insulating base.

7. The circuit board structure according to claim 4, wherein the positioning parts and the circuit substrate are in a one-piece form, and the positioning parts are located on a peripheral surface of the circuit substrate facing the ceramic substrate.

8. The circuit board structure according to claim 4, wherein each positioning part comprises a projection with a protrusion width, and a size of the protrusion width is equal to or less than 50 μm.

9. The circuit board structure according to claim 4, wherein the insulating base comprises at least one insulating via hole, and the first copper foil is disposed on a wall surface of the insulating via hole.

10. The circuit board structure according to claim 4, further comprising a chip disposed on the circuit layer and located above the ceramic substrate.

\* \* \* \* \*